US008872390B2

(12) United States Patent
Buchheim et al.

(10) Patent No.: US 8,872,390 B2
(45) Date of Patent: Oct. 28, 2014

(54) WIRELESS COMMUNICATION-ENABLED ENERGY CONSUMPTION MONITOR AND MOBILE APPLICATION FOR SAME

(71) Applicants: James Buchheim, Aventura, FL (US); Arne Hennig, Davie, FL (US)

(72) Inventors: James Buchheim, Aventura, FL (US); Arne Hennig, Davie, FL (US)

(73) Assignee: SSI America, Inc., Fort Lauderdale, FL (US)

( * ) Notice: Subject to any disclaimer, the term of this patent is extended or adjusted under 35 U.S.C. 154(b) by 0 days.

(21) Appl. No.: 14/068,043

(22) Filed: Oct. 31, 2013

(65) Prior Publication Data

US 2014/0117780 A1 May 1, 2014

Related U.S. Application Data

(60) Provisional application No. 61/720,473, filed on Oct. 31, 2012.

(51) Int. Cl.
*H01H 9/54* (2006.01)

(52) U.S. Cl.
USPC ............................................................ 307/140

(58) Field of Classification Search
USPC ............................................................ 307/140
See application file for complete search history.

(56) References Cited

U.S. PATENT DOCUMENTS

2013/0085620 A1* 4/2013 Lu et al. .................. 700/286

* cited by examiner

*Primary Examiner* — Robert L. Deberadinis
(74) *Attorney, Agent, or Firm* — Mark M. Friedman

(57) ABSTRACT

A device and method including: an energy consumption sensor; a wireless communications component adapted for wireless communication; a processing unit, adapted to receive energy consumption data from the energy consumption sensor and transmit the energy consumption data via the wireless communications component; and a switch having: a closed state coupling the input end of the device to the output end of the device, and an open state, disconnecting the input end of the device from the output end of the device.

27 Claims, 11 Drawing Sheets

FIG. 5  Main System Flow

FIG. 6     Wireless Data Transfer Subroutines

Proximity Switch Process – Device Side

Manual On/Off – Energy Shield – Application Side

WIRELESS COMMUNICATION-ENABLED ENERGY CONSUMPTION MONITOR AND MOBILE APPLICATION FOR SAME

This patent application claims the benefit of and priority from U.S. Provisional Patent Application No. 61/720,473, filed Oct. 31, 2012.

FIELD AND BACKGROUND OF THE INVENTION

The present invention relates to energy consumption monitoring and adaptor devices and related mobile applications and, more particularly, to plug-in energy monitors which is an energy monitoring device that plugs in between an appliance and the electricity socket. The monitor measures power consumption for a single device (or multiple devices) and transmits the information using wireless communication technology such as Bluetooth and/or WiFi to a computing device such as a smart phone. The smart phone has a corresponding application that interprets the received information and displays relevant information such as consumption, cost etc.

Energy consumption monitors are known in the art. Plug-in energy consumption monitors are also known in the art. All known plug-in energy consumption monitors include a display and activation keys on the device itself. This makes programming the device and reading the display inconvenient and reduces the level of usefulness of the device, especially with regards to a user's ability to monitor energy usage in real time and/or view historical data of the usage.

It would therefore be highly advantageous to have an energy consumption monitoring device capable of both remote programming as well as a remote display. Preferably the programming and display are effected on a mobile communications device such as a smart phone, tablet computer, PDA, laptop but can even be effected on a desktop computer.

SUMMARY OF THE INVENTION

The present invention successfully addresses the shortcomings of the presently known configurations by providing an accurate and timely system for monitoring current and/or previous energy consumption as well as cost for the energy currently being consumed. The mobile application receives real-time data from the monitor-adaptor and converts the consumption data into cost data. In order to provide accurate cost data, the mobile application accesses location data via GPS or cellular network location information. Once the application ascertains the exact location, the application downloads the local electricity tariff(s) (tariff data) for energy consumption and calculates the exact cost of energy consumption based on the tariffs.

According to the present invention there is provided a device having an input end for operationally coupling to a power outlet and an output end for operationally coupling an appliance, the device including: (a) an energy consumption sensor; (b) a wireless communications component adapted for wireless communication; and (c) a processing unit, adapted to receive energy consumption data from the energy consumption sensor and transmit the energy consumption data via the wireless communications component.

According to further features in preferred embodiments of the invention described below the device further includes: (d) a switch, the switch having: a closed state coupling the input end of the device to the output end of the device, wherein the switch in the closed state is adapted to allow power to flow from the operationally coupled power outlet to the appliance operationally coupled thereto, and an open state, disconnecting the input end of the device from the output end of the device, wherein the switch in the open state is adapted to disallowing power flow between the operationally coupled power outlet and the appliance operationally coupled thereto.

According to still further features the processing unit is further configured to selectively reversibly transform the switch from the closed state to the open state.

According to still further features the device further includes (d) a memory component, adapted to store the energy consumption data.

According to still further features the processing unit is further adapted to transmit the stored energy consumption data via the wireless communications component.

According to still further features the processing unit is further capable of wirelessly communicating with a related external device via the wireless component. A related external device is a device which is wireless operationally coupled to the adaptor-monitor device is a manner known in the art as "paired", "connected" or otherwise coupled together.

According to still further features the processing unit is configured to receive instructions from the related external device via the wireless communication component.

According to still further features the processing unit is configured to selectively reversibly transform the switch from the closed state to the open state based on the received instructions.

According to still further features the processing unit is configured to selectively reversibly transform the switch from the closed state to the open state based on proximity to the related external device.

According to still further features the processing unit is configured to selectively reversibly transform the switch from the closed state to the open state according to a predefined set of instructions.

According to still further features the related external device is a computing device configured to display the data on a Graphical User Interface (GUI).

According to still further features the computing device is a mobile computing device.

According to still further features the wireless communications component is adapted to wirelessly transmit the stored energy consumption data to a computing device configured to display the data on a Graphical User Interface (GUI).

According to still further features the GUI includes features selected from the group consisting: a real-time consumption feature, a monetary conversion feature, a usage history feature, an alert feature.

According to still further features the wireless communications component is a Bluetooth Low Energy component.

According to still further features the related external device is a storage hub, the storage hub adapted to receive the usage data from multiple devices.

According to another embodiment there is provided a method in a mobile computing device (MCD) including the steps of: (a) receiving, at the MCD, consumption data transmitted from an energy consumption adaptor-monitor (SCAM) device, for processing by a consumption application running on the MCD; (b) processing the consumption data to receive display values; (c) displaying the display values in a user interface of the consumption application, running on the mobile device.

According to further features the method further includes the step of: (d) receiving a unique user identifier (UUID) together with the consumption data, the UUID identifying the ECAM device which sent the consumption data.

According to still further features the method further includes the step of: (d) storing the consumption data on a storage device.

According to still further features processing includes calculating a usage fee. According to still further features calculating the usage fee includes retrieving tariff data for the energy consumption from a storage device and calculating the usage fee based on the retrieved tariff data.

According to still further features the storage device is selected from the group comprising: a local storage device and a remote storage device wherein the tariff data is retrieved from the remote storage device over a network.

According to still further features the network is selected from the group consisting of: a Local Area Network, a wide area network, a cellular data network.

According to still further features processing includes calculating a projected usage fee over time based the received consumption data.

According to still further features processing includes calculating a usage fee over a given period of time based on consumption data stored on the storage device.

According to still further features the storage device is selected from the group consisting of a local storage device and a remote storage device.

According to still further features the stored consumption data is retrieved from the remote storage device over a network.

According to still further features the network is selected from the group consisting of: a Local Area Network, a wide area network, a cellular data network.

According to still further features the method further includes the step of: (d) receiving consumption data from at least one additional ECAM device.

According to still further features the step of displaying the display values, includes displaying display-values for each of the at least two ECAM devices, distinctly from each other, on the user interface.

According to still further features the method further includes the step of setting alarm parameters, prior to step (a).

According to still further features the processing step includes comparing the received consumption data to the alarm parameters and issuing an alert notification when the received consumption data exceed the alarm parameters.

According to still further features the method further includes a step of sending a deactivation command to the ECAM device identified by the UUID, after receiving the notification alert.

According to another embodiment there is provided a method for use of a mobile communications device (MCD), the method comprising the steps of: (a) sending a Proximity Switch Activation Command from the MCD; (b) receiving a signal from an energy conservation adaptor-monitor (ECAM) device at the MCD; (e) determining whether the MCD is within a predefined distance range from the ECAM device; and (d) sending an activation command to the ECAM device when the MCD is within the predefined distance range from the ECAM device.

According to another embodiment there is provided a computer program product, the computer program product comprising a non-transitory computer readable storage medium having computer usable program code embodied therewith, the computer usable program code including: computer usable program code configured to receive at a mobile computing device (MCD), a wireless signal from a energy conservation adaptor-monitor (ECAM) device; computer usable program code configured to receive, user input on a consumption application running of the MCD, for issuing instructions to the ECAM device; and computer usable program code configured to send the instructions to the ECAM device wherein the instructions include a command to selectively reversibly transform a switch from an open state to a closed state.

BRIEF DESCRIPTION OF THE DRAWINGS

Various embodiments are herein described, by way of example only, with reference to the accompanying drawings, wherein.

DESCRIPTION OF THE PREFERRED EMBODIMENTS

Figures 1, 2A, 2B:
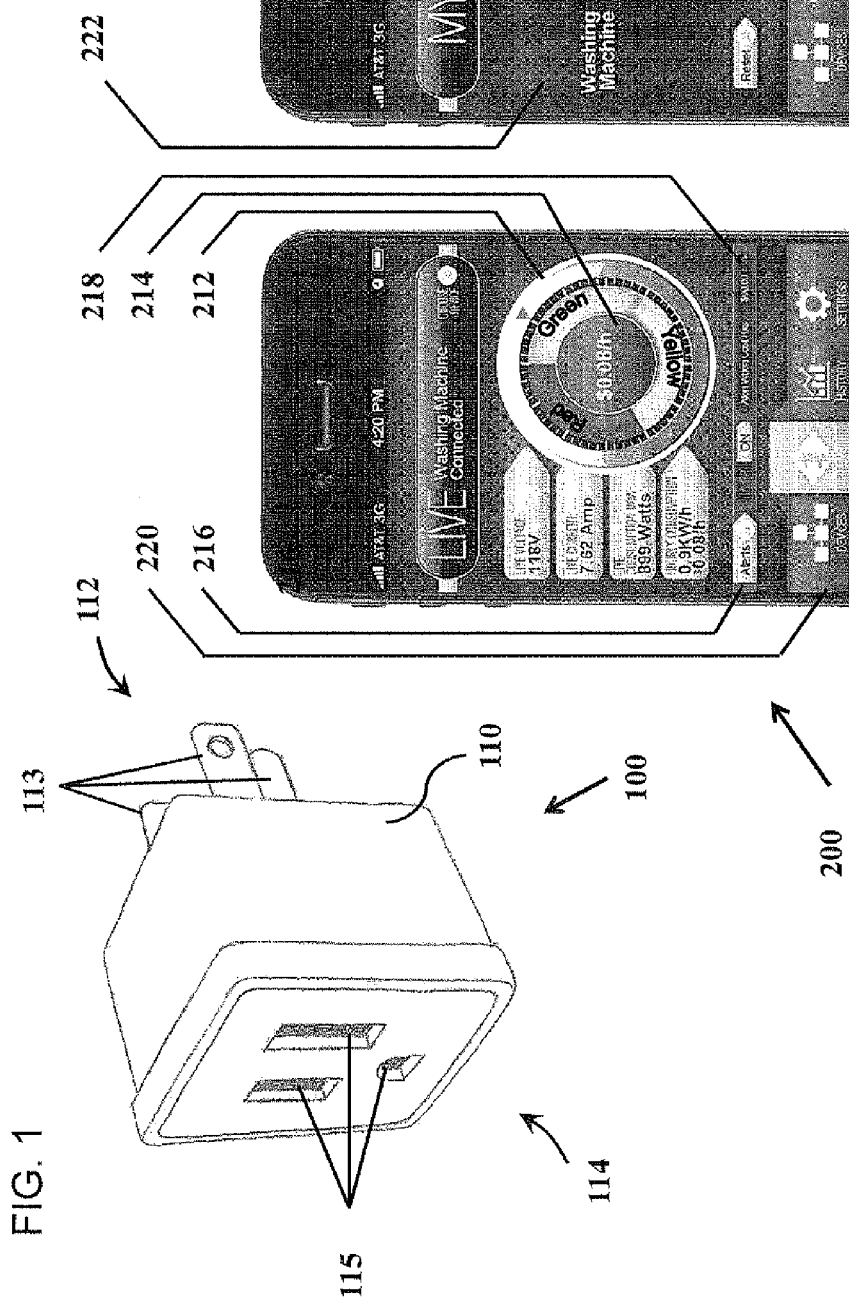
FIG. 1 is an isometric view of a power meter monitoring adaptor of the immediate invention.
FIGS. 2A and 2B are screen shots different features of the mobile application of the immediate invention.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), a cellular data network (e.g. GSM, GPRS, EDGE, UMTS etc.), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions to may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The principles and operation of a power monitoring system according to the present invention may be better understood with reference to the drawings and the accompanying description.

Referring now to the drawings, FIG. 1 illustrates an adaptor of the immediate invention. The adapter is a plug-in energy consumption monitoring device. The adaptor houses various components described in further detail with regards to FIG. 3. The adaptor preferably has a small form factor, does not include a display and has no function keys. The adaptor/monitor transfers or communicates with a computing device wirelessly. Preferably the computing device is a mobile communications device (MCD) such as a smart phone, tablet computer, PDA and the like.

Preferably the adaptor transfers the data via Bluetooth. More preferably the adaptor transfers the data via Bluetooth Low Energy. Preferably the adaptor additionally or alternatively communicates wirelessly via WiFi.

Preferably the application downloads tariff information from a centralized system database (located on a computer readable storage device/medium) including up-to-date tariff information for the user location. In some embodiments, the application downloads tariff information directly from the utility provider website/database. In some embodiments, the application first attempts to retrieve the tariff information from the system database. If the system database does not have the necessary tariff information, or if the information is not currently up-to-date, then the application accesses the utility provider website/database and accesses the information from there. Of course, if the tariffs are regulated by a governing body, the application accesses tariffs from that source.

It is important to note that many regions have varied tariffs for energy consumption. Some tariffs differ from season to season (e.g. summer tariffs are higher than spring or fall) while other tariffs differ from hour to hour during the same day (e.g. a higher tariff during daylight hours when consumption is highest). The immediate application module calculates the cost per energy consumption based not only on the location but also on the currently enforced tariff. In another embodiment, the tariff data/information is manually stored in the database by individual users, and accessible by any other users. This type of data collection, know as "crowd sourcing", "social networking", "online collaboration" and other similar terms, and is a tried and tested method for sourcing information from individuals who are not necessarily experts in the field or official parties. One very good example of such a method of data collection is the online encyclopedia Wikipedia™.

In one embodiment, the power consumption meter (adaptor I monitor) need only to transmit basic data regarding power consumption, leaving the complex computations to the mobile application. In another embodiment, the adaptor-monitor is capable of various computational functions as detailed below. The adaptor need not be complex, expensive or even very big. There is no need for a display or function keys. The form factor is therefore relatively small compared to other energy monitors and much less expensive. Finally, as the transmitted data is simple, the transmission medium can be Bluetooth Low Energy, which consumes minimal amounts of energy and transmits data at relatively low frequencies.

Adaptor/Monitor Device

Figure 3:
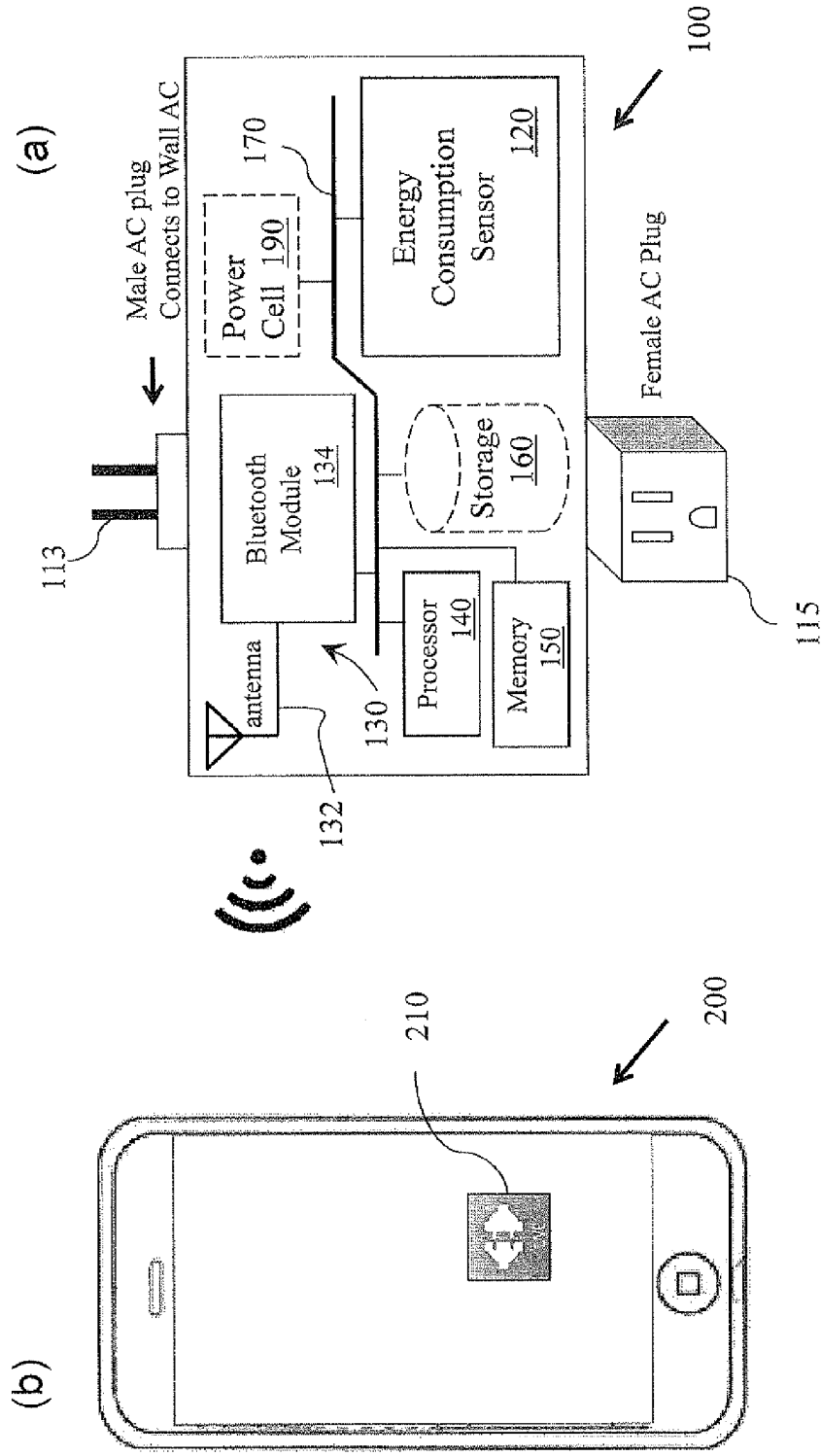
FIG. 3 is a block diagram of an embodiment the immediate system including (a) a monitor-adaptor and (b) a mobile device in data communication.

Referring now to FIGS. 1 and 3, FIG. 1 depicts an isometric external view of an exemplary embodiment of a power consumption adaptor 100. The adaptor of the immediate invention is a display-less, plug-in energy consumption monitoring device which includes a housing 110 having an input side 112 and an output side 114. The input side includes electrical connectors (male connectors) 113 such as plug prongs or blades with which the adaptor connects to an electrical socket or power point. The output side includes electrical contacts (female connectors) 115 which are similar to the electrical contacts of an electrical socket. The contacts are adapted to receive electrical connectors such as prongs or blades (and the like) of an electrical appliance.

The monitor/adaptor further includes an energy consumption sensor 120 for sensing the amount of energy the attached appliance is consuming from the electrical outlet or power point.

The monitor also includes a wireless communications component 130 such as a WiFi or Bluetooth (or other wireless technology) antenna 132 and transceiver module 134. The device further includes a processing unit such as a microprocessor or processors or central processing unit (CPU) 140 and the like which manages the sensor values received from the sensor and transmits the consumption data via the wireless component 130. In some embodiments, the device includes memory 150 which may be a volatile or a non-volatile memory, or a combination of both. An example of a volatile memory is Random Access Memory (RAM) and an example of non-volatile memory is Read-Only Memory (ROM). Alternatively, a microcontroller (not shown) can be used to fulfill the above functions.

In some embodiment, the adaptor includes a power cell 190 which can be used as a secondary or primary energy source and can be rechargeable or non-rechargeable. In the case of a loss of power from the power grid, the adaptor will continue to function.

In some embodiments, the monitor includes a storage medium/device 160 for locally storing recorded usage data over large periods of time. In this configuration, the mobile device has the ability to synchronize with the power consumption monitor device, when connected via Bluetooth (and/or other wireless means, such as WiFi), and download all the stored usage data, and display it on the device. The storage device may include all previously stored data or only data stored since the last time the mobile application and monitor synchronized. The processing unit transmits the data via the wireless component(s). Alternatively, the storage device is adapted to store historical usage data for a predetermined amount of time (e.g. a limited or even an unlimited amount of time), while the processing unit is configured to only upload the delta of stored usage data since the last time the adaptor synchronized with the mobile device. All the internal components of device 100 are connected together via a system bus 170. In some embodiments, adaptor 100 only transmits data wirelessly to a remote computing device.

Figure 4:
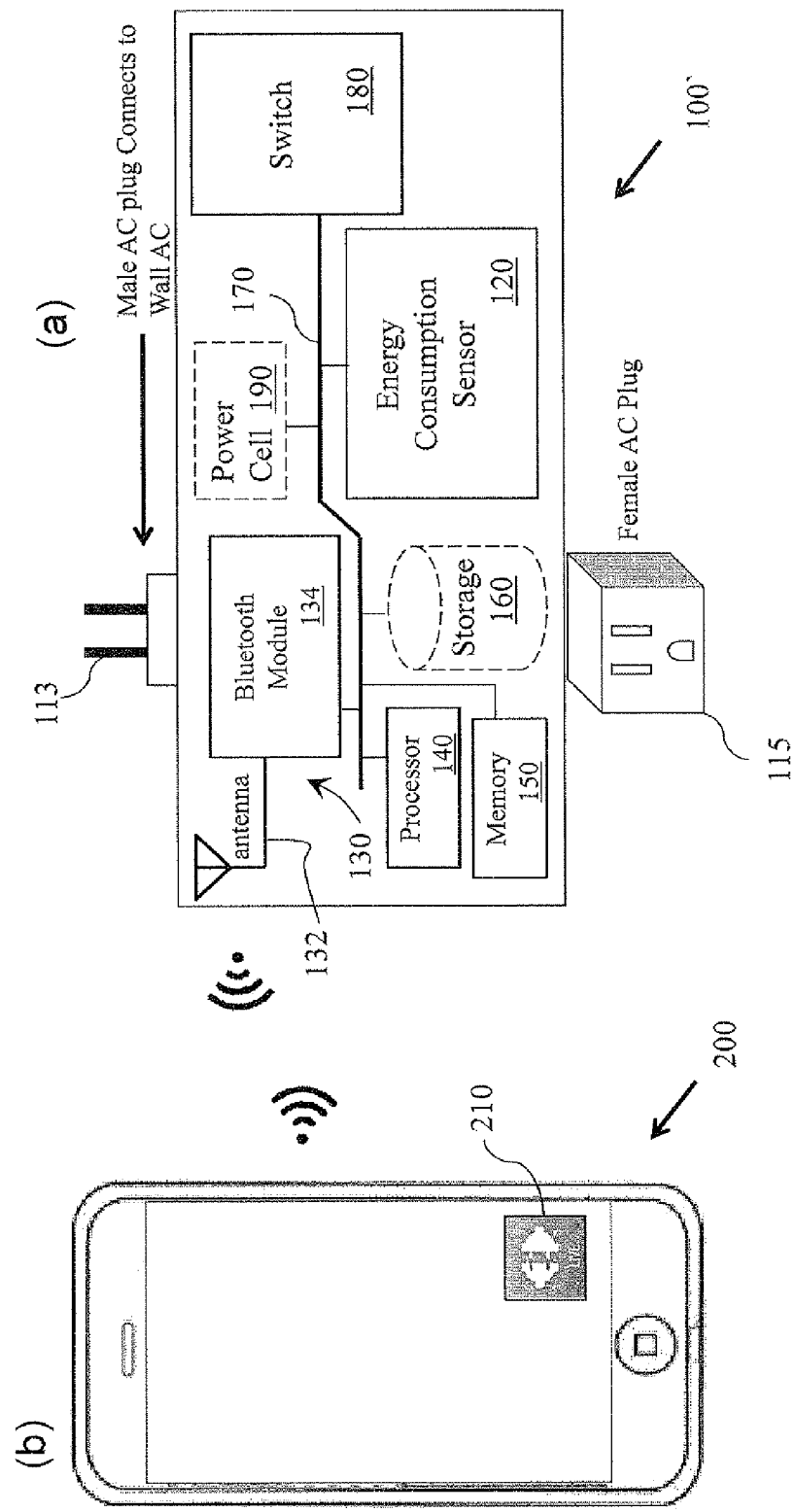
FIG. 4 is a block diagram of a second embodiment of the immediate system including (a) a monitor-adaptor and (b) a mobile device in data communication.

Another embodiment of the invention is depicted in FIG. 4. FIG. 4 depicts an adaptor 100' which communicates wirelessly with a remote computing device. Preferably the remote or external computing device is a mobile communications device (MCD). An example of an MCD is a smart phone 200, depicted in FIG. 4b. Adaptor 100' includes all of the same components as adaptor 100 with the addition of a switch 180. Switch 180 has a closed state and an open state. In the closed state, the switch connects the female electrical contacts 115 to the power flow passing through the male connectors 113. In the open state, the switch does not connect electrical contacts 115 to male connectors 113 and therefore power does not flow from the outlet to the contacts (and hence any appliance connected to the adaptor). Switch 180 is configured to be electronically toggled in order to selectively allow, or cut off, power flow from power outlet to the female electrical contacts (and hence any appliance connected to the adaptor). In one preferred embodiment the switch is a relay. In some embodiments the switch is controlled by a microcontroller. In other embodiments switch 180 is controlled by the components depicted in FIG. 4a. Switch 180 can be remotely actuated/controlled by the remote or external computing device or MCD 200.

MCD 200 runs a Power Consumption Management Application, or simply consumption application 210. Of course the remote device can be a desktop PC (or similar) or a laptop, tablet computer, PDA or any other device capable of wireless communications. MCD 200 initially connects to adaptor 100/100' and stores the devices Unique User Identifier (UUID) which may be, or include, the device MAC ID, or some other UUID broadcast by the device. The MCD 'pairs', couples or is otherwise related with the device so that the devices will recognize each other (or, in some embodiments, only the MCD will recognize the adaptor device) in the future.

In some embodiments, the processing unit also controls/manages the energy flow between the outlet and appliance. Upon receiving a command or according to instructions, the processing unit can allow or restrict (disallow) the flow of energy from the outlet to the appliance. That is to say that the processing unit can selectively connect the appliance to the power source and disconnect the appliance from the power source. According to some features of the system, MCD 200 can receive a command from a user, via mobile application 210, to turn an appliance on or off. Alternatively and/or additionally, upon activation of a Proximity Switch feature, a selected adaptor can activate or switch on when the paired MCD is within a predefined proximity range of the adaptor device (e.g. a fan, equipped with an adaptor, can turn on when an MCD approaches.

In other embodiments or features, an adaptor device can be programmed with a set of instructions. In one embodiment, the adaptor device can include a programmed alert based on energy consumption levels. When the appliance reaches a predefined energy or cost limit, the processing unit can disconnect the appliance from the power source. In other embodiments, the aforementioned functions are effected by, or on, mobile application 210 (see further details below).

In some embodiments, the wireless communications unit transmits energy consumption data, including stored energy consumption data, to the computing device, e.g. an MCD, to be displayed on a Graphical User Interface of the device.

In some embodiment, where the adaptor device does not include a storage device, the adaptor transmits usage data to a storage hub. The storage hub is adapted to receive storage data from multiple adaptor devices. The storage hub can communicate with a paired computing device to facilitate transfer of usage data and/or synchronization of stored usage data between the hub and computing device or MCD.

Mobile Application

FIGS. 2A and 2B depict screen shorts of the mobile application of the immediate invention. The screen shots are merely exemplary and are intended to illustratively depict various features of the immediate mobile application and hence innovative system. Exemplarily, the application includes, but not limited to, some or all the following useful features:

(a) cost display in Dollars or local currency;
(b) live information display (cost in local currency or consumption in energy terms of KW/h, voltage, watts, amperage etc.);
(c) recording and/or displaying usage history such as, cost last hour, last day, last week, last month etc.;

(d) multiple adaptor management, providing information regarding each of the appliances separately and all of them together;

(e) Programmable alerts, to alert the user, if a selected appliance which is being monitored consumes energy above a selected usage limit (e.g. a $2 for an electric heater);

(f) a projected usage fee over time according to current usage;

(g) a Manual On/Off control for single or multiple devices;

(h) a Proximity Switch;

(i) a Standby Energy Conservation feature (also known as Vampire Shield, for preventing 'vampire energy loss').

FIG. 2A depicts a screen shot of the exemplary embodiment of the 'Live' feature of the application during exemplary usage. Smart phone 200 is wirelessly coupled to the power meter device 100 (preferably via Bluetooth and more preferably via Bluetooth Low Energy). The adaptor is connected between the washing machine plug and wall socket. Power consumption is illustrated on a power consumption indicator wheel 212 having three segments. The top right segment is colored green, indicating that the washing machine is working within desired parameters. The bottom segment is yellow. Should the small triangular indicator be within this region, the user is warned that machine is consuming a higher than usual amount of energy. If the indicator falls within the top left region, which is colored red, this indicates that the washing machine is using very high amounts of energy. The center of the wheel 214 displays the cost in Dollar per hour at the currently indicated consumption level.

On the left of the wheel are provided various indicators including Live Voltage, Live Current, Live Consumption Now and Hourly Consumption. Next to each indicator is displayed the real-time or live measurement, according to the data relayed from the monitor-adaptor on the washing machine. There is also provided an alert function button 216 that allows setting a user-defined limit of amount of money which is displayed in the 'Alert When Cost Hits: $00.00' area 218. A bottom menu 220 provides a quick function for swapping between features of the application. In the exemplary screen shot, the features menu includes: Devices, Live, History and Settings buttons. The Devices feature allows the user to manage more than one device. The Live feature is currently displayed in the screen shot. The History feature 222 is displayed in the screen shot of FIG. 2B. The Settings feature allows the user to adjust various settings.

FIG. 2B depicts an exemplary screenshot of a History feature of the immediate mobile application. The History feature of the application displays the consumption history of the washing machine in monetary terms. Indicators are provided for the last hour, last day, last week, last month and last year. A Reset function allows the user to reset the currently displayed meters. In some embodiments, the application can send an instruction to the adaptor-monitor to reset the local memory (in embodiments of the adaptor in which such a memory exists). Social network 'share' buttons allow the application to share the meter information via the given social networks.

Figure 5:
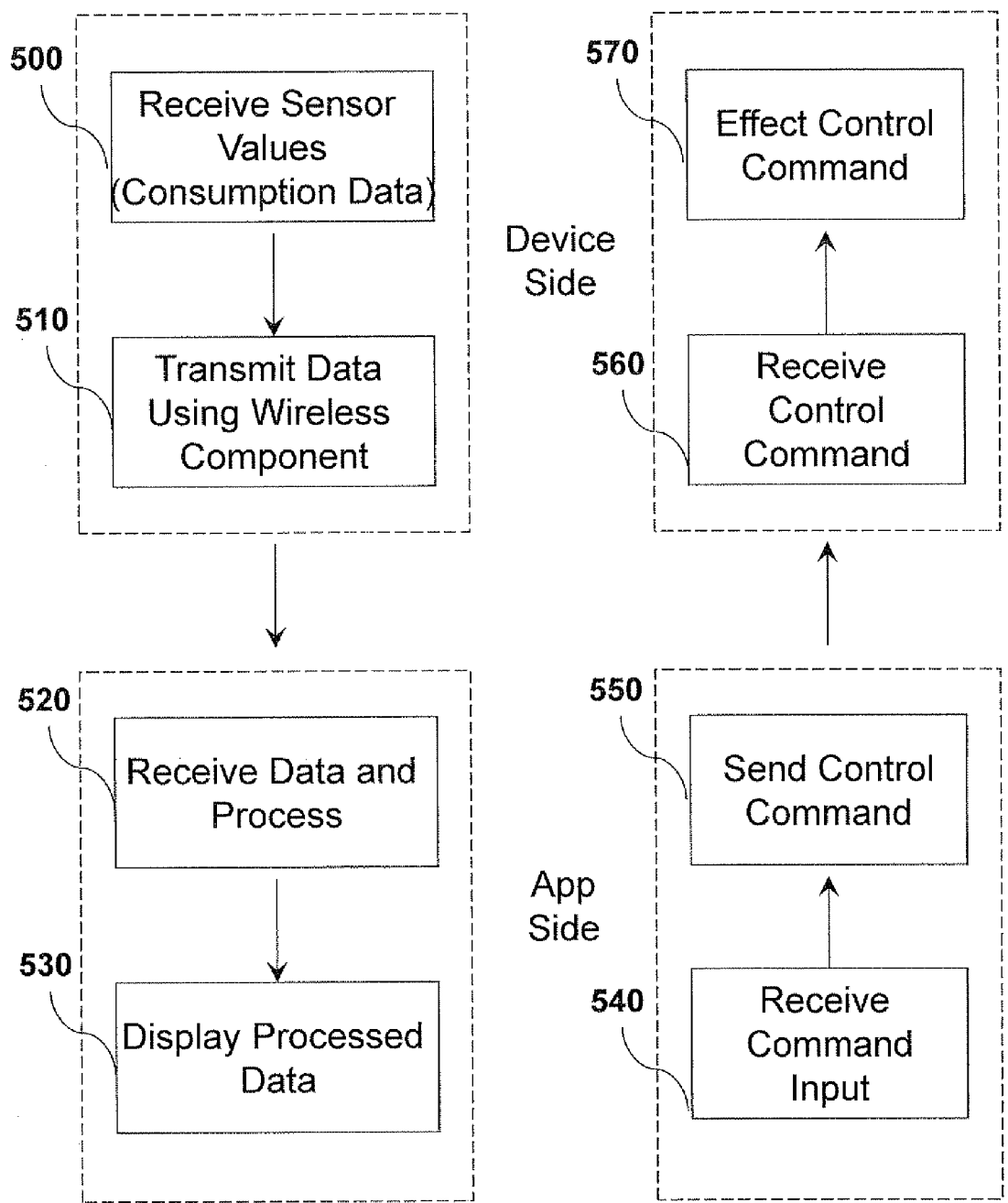
FIG. 5 is a main flow diagram of the system.

Referring now to the flow diagrams, FIG. 5 depicts a main flow diagram. In step 500, the adaptor-monitor device (e.g. adaptor 100 or 100') receives sensor values from the energy sensor. In step 510 the values are transmitted/broadcast wirelessly. In step 520 to a computing device (e.g. MCD 200) running a software application (e.g. mobile application 210) receives the data and processes the data according to the application logic. In step 530 the processed data is displayed on the device display (preferably in a user friendly GUI).

In a distinct procedure or further step, a user inputs a command into the application interface on the device in step 540. In step 550 the application transmits the command or instructions to a paired or connected adaptor-monitor device (e.g. adaptor 100'). In step 560 the monitor-adaptor device receives the control command or instructions. In step 570 the device effects the command instructions.

Figure 6:
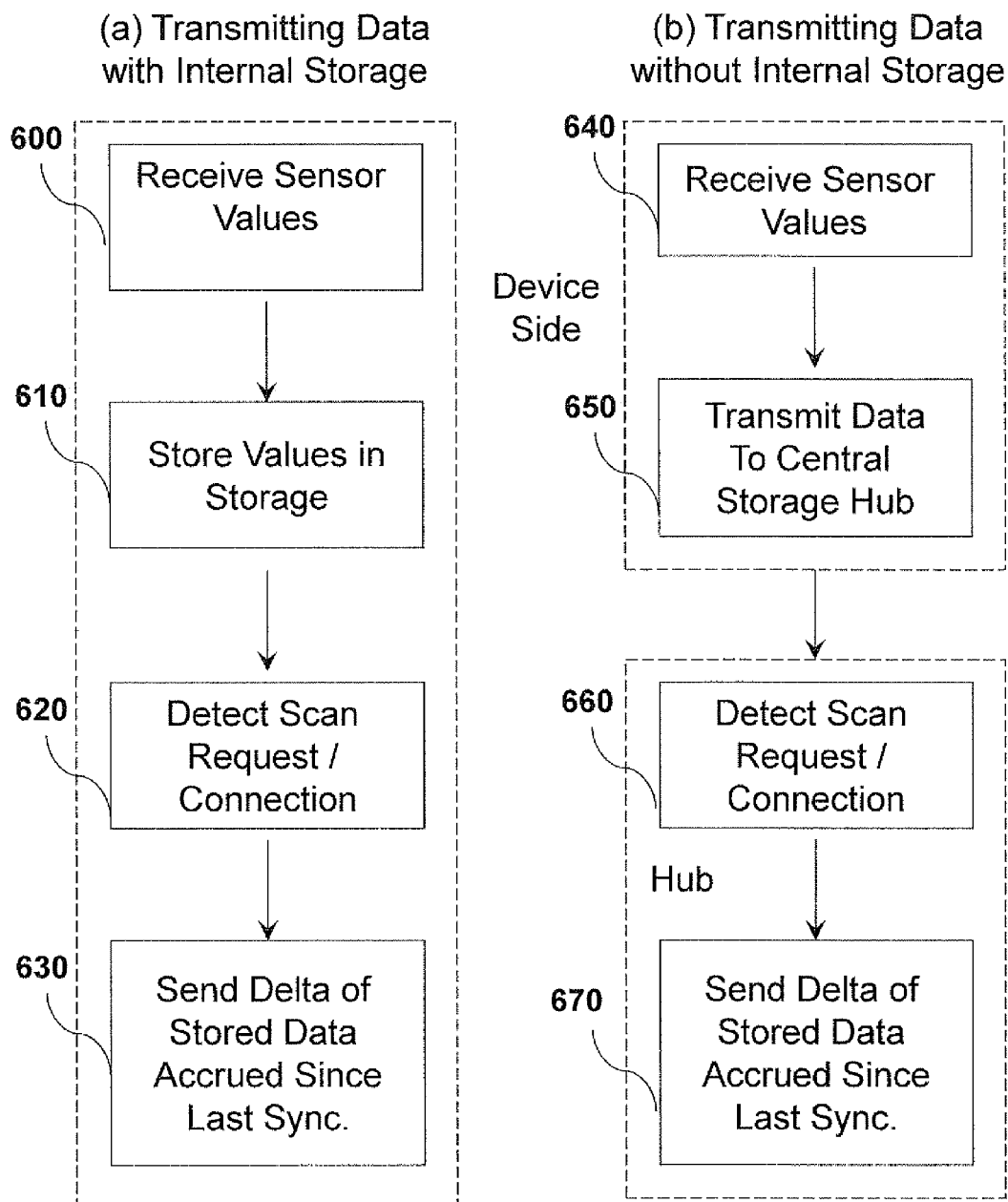
FIG. 6 displays flow diagrams of two wireless data transfer subroutines.

FIG. 6 depicts flow diagrams of two wireless data transfer subroutines. Subroutine (a) details steps for transmitting data from a monitoring device with an internal storage. Subroutine (b) details steps for transmitting data from a monitoring device without an internal storage unit.

In step 600 of subroutine (a), the adaptor receives sensor values from the energy consumption sensor. In step 610 the values are stored in an internal storage unit (e.g. storage 160). Exemplarily, the storage data can include a time stamp from an internal clock so that the storage data is distinctly delineated so as to provide a more complete record of energy usage. For further example, the stored data can reflect when the appliance started being used, when it stopped being used, how much energy was consumed each time the appliance was activated and so on.

In step 620 the device receives a wireless scan request signal from a remote device. In another embodiment, the device becomes connected with—, or otherwise operationally coupled to—, the remote device.

In step 630, in both of the aforementioned embodiments, the device transmits the stored consumption data (either simply the sensor values or additional data as mentioned above) wirelessly to the remote device. In some embodiments, the storage device stores all the consumption data and transmits all the data each time a remote device requests the data. In another embodiment, the device only transmits newly accrued data since a previous transmission of the data. In still another embodiment, the storage device only stores data according to predefined parameters (e.g. last day, last week, last month). A predefined parameter can be to limit storage of data to new data received after the last transmission of data to the remote device.

In step 640 of subroutine (b), an adaptor-monitor device without an internal storage unit receives sensor values from the energy consumption sensor. In step 650, the device transmits the data to a central hub for storage. The storage hub is adapted to receive storage data from a single, or multiple, adaptor devices. The storage hub can communicate with a computing device which is operationally connected to the hub, in order to facilitate transfer of usage data and/or synchronization of stored usage data between the hub and computing device or MCD. Having a central storage hub has many advantages. Some of the advantages include allowing the adaptors to be more simple devices which do not include a storage facility. All data from the devices is sent to the hub and handled by the hub. The computing device or MCD only has to connect with the hub to receive all the usage data and stored information.

In step 660 the hub detects a scan request or is connected to the remote computing device. In response to the request/connection from the remote device, the hub, in step 670, sends the stored data or delta of accrued storage data since the last synchronization to the remote device.

Figure 7:
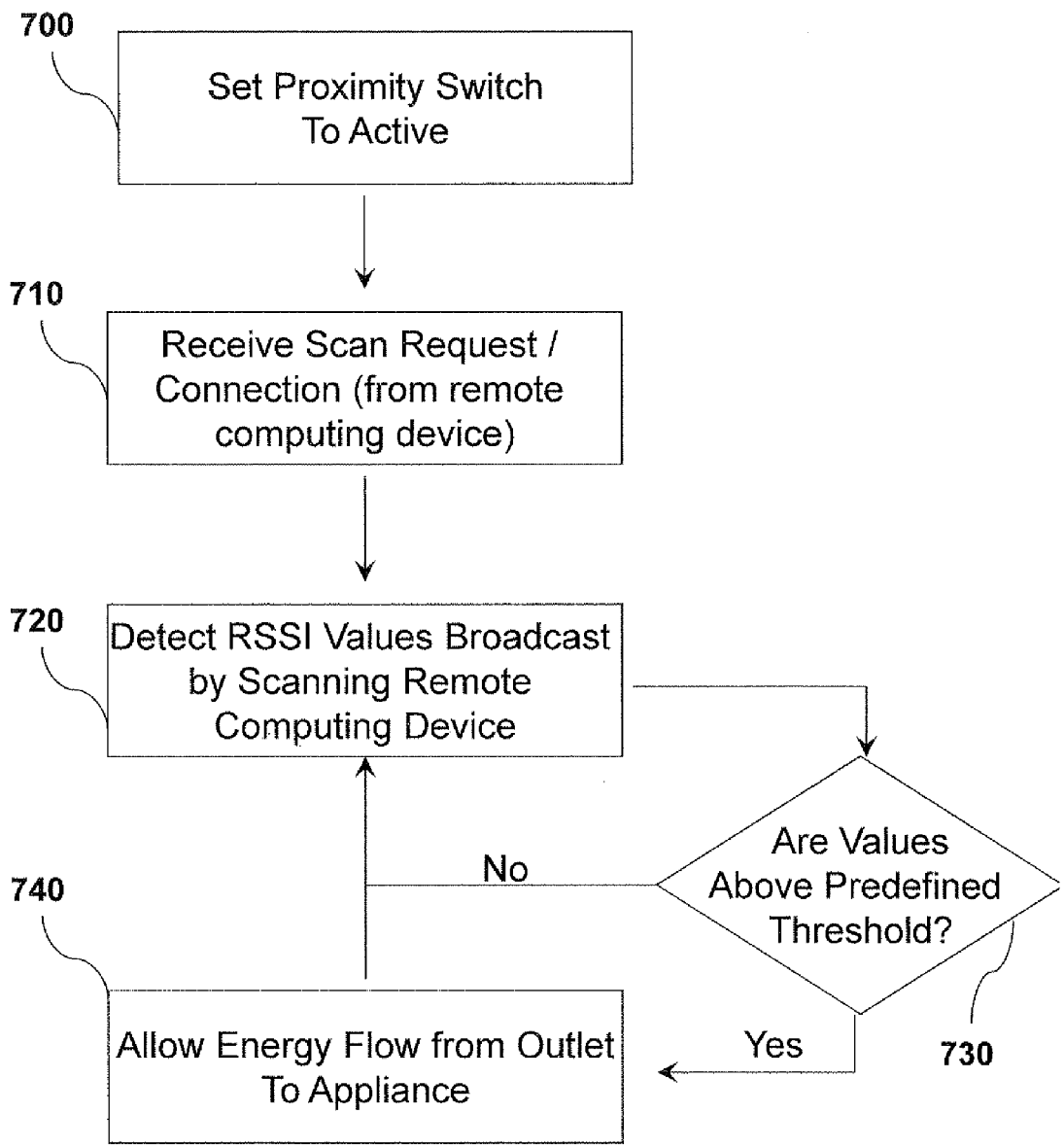
FIG. 7 is a flow chart of a proximity switch process.

FIG. 7 is a flow chart of a proximity switch process which occurs on the monitor-adaptor device. In step 700 the adaptor receives instructions to activate the Proximity Switch Process. Generally the instructions/commands are sent from a remote computing device which is wirelessly connected to the adaptor device. Preferably, the remote device is an MCD running a mobile application (known as a "mobile app" or simply "app"). In step 710 the device receives a scan request from the remote device, or automatically connects to the remote device. The scan request or automatic connection can occur when the remote device and the adaptor come into sufficiently close proximity for at least one of the devices to receive wireless signals (e.g. Bluetooth signal) sent from the other device.

In step 720 the adaptor device detects or determines the received signal strength indicator (RSSI) values of a signal(s) that is broadcast from the remote computing device. Generally, the RSSI values can give an approximation of distance between the source of the signal and recipient. Therefore, an approximate, desired distance, between the remote device and the adaptor, can be quantified as an RSSI value parameter.

Thus, in step 730 the processing unit or other logic on the adaptor device compares the average RSSI values received from the remote device signal to a predefined threshold parameter to establish whether the remote device is close enough to the adaptor device or not.

If the remote device is not close enough, then the device continues to monitor the RSSI values. If the remote device is close enough to the adaptor, according to the predefined parameter, then, in step 740, the adaptor allows energy to flow from the power outlet to the appliance operationally coupled to the adaptor. For example, a microcontroller can toggle a switch from an open state to a closed state, as described above. Once the remote device is no longer proximally collocated with the adaptor, the switch reverts to the open state, disconnecting the power flow to the attached device. In another embodiment, detailed with reference to FIG. 10 below, the proximity switch process can be accomplish from the app side, as opposed to the device side.

Figure 8:
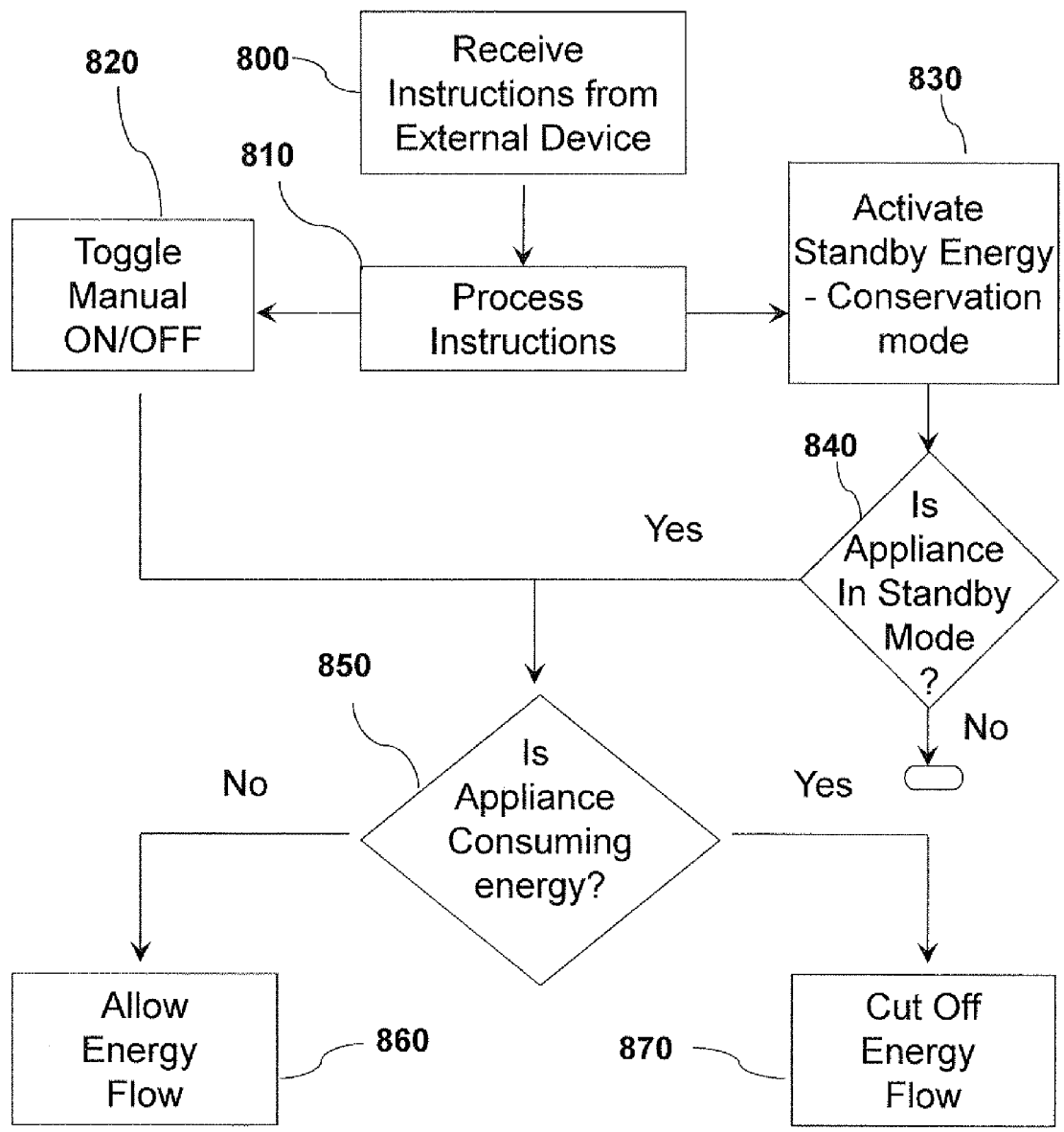
FIG. 8 is a flow chart depicting two optional functions that can be effected on the adaptor device side.

FIG. 8 is a flow chart depicting two optional functions that can be effected on the adaptor device side. In step 800 the monitor-adaptor device receives instructions from a remote computing device or MCD. Exemplarily, the instructions can be sent from the MCD after a user selects the command via the GUI of the mobile app.

In step 810 the processing unit of the adaptor device processes the instructions sent from the remote device and sends the appropriate commands to the relevant components of the adaptor device.

In step 820, the instructions ('Toggle Manual On/Off Switch') from the remote device are processed into commands to toggle the device switch. The processor sends a command to the switch (e.g. relay switch 180) to toggle the state of the switch. If the switch is in an open state (step 850), then the switch must now move to a closed state (activation/connected/allow energy flow from the power outlet to the attached appliance—step 860). If the switch is in a closed state, then the switch must now move to an open state (deactivation/disconnected/cut off energy flow from the power source to the appliance attached to the adaptor—step 870).

In step 830, the instructions from the remote device ('Activate Standby Energy Conservation mode') are processed into commands to toggle the switch based on a predefined set of parameters.

In step 840, the device logic determines whether appliance attached to the adaptor is in a standby mode. If the appliance is in a standby mode, then, in step 850, the immediate function determines whether the appliance is expending 'vampire power', i.e. leaking electricity even though the appliance is supposed to be 'inactive' or in standby mode. If the appliance is still drawing power, then, in step 870, the switch is changed to the open state, cutting off energy from the appliance. If the appliance, in standby mode, is not drawing energy (or not drawing more than a predefined limit of energy), then in step 860, the flow of energy continues to be allowed and the switch remains in the closed state.

Figure 9:
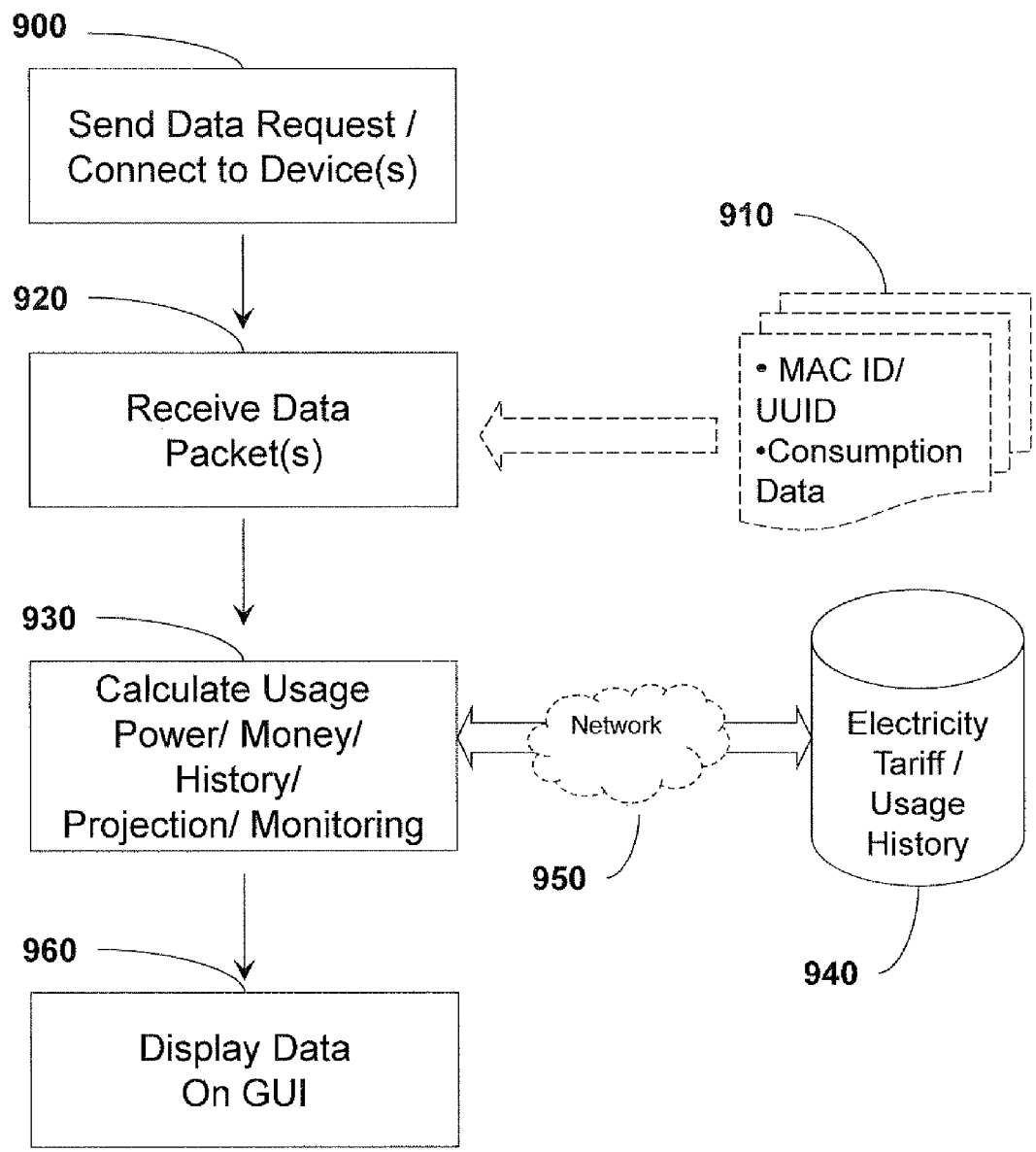
FIG. 9 is a flow chart depicting a usage-data display process effected on the application side of the inventive system.

FIG. 9 is a flow chart depicting a usage-data display process effected on the application side of the inventive system. In step 900 the remote computing device, preferably an MCD sends a request to receive usage data from the energy consumption adaptor-monitor (ECAM). Alternatively and/or additionally, the remote device may be constantly connected, or automatically connect, to the adaptor. In any of the aforementioned scenarios, an energy consumption application running on the remote device, preferably in the form of a mobile app, sends the request to the adaptor device. The connection is of course wireless, preferably via Bluetooth and even more preferably over Bluetooth Low Energy (BLE) communication.

In step 910, the adaptor device or storage hub sends the data packets.

In step 920, the remote device receives the data packets, including the energy consumption information, from the adaptor (or in another embodiment, from the storage hub). The data packets of the broadcast signal, in preferred embodiments, also include a UUID (such as a MAC ID) in addition to the consumption data.

In step 930, the consumption application, or mobile app, processes the consumption data in order to receive display values that can be displayed on the GUI of the remote device or MCD. The processing step includes calculating how much the used energy costs in local currency. Calculating the usage fee can only be accomplished when the energy tariff is known. In step 940, the tariff information is retrieved from a storage device. In one embodiment the energy tariff is inputted manually by the user and stored on the hard drive or other storage media of the remote computing device. In another, preferred embodiment, the tariff data is downloaded from the database stored on a storage device of a system server (the system server can retrieve the data from any known source or the data can be submitted to the server by individuals ["crowd sourcing"] as discussed above) over a network (e.g. LAN, WAN, Cellular data network etc., any of which could accesses a remote server over the Internet), in step 950.

Another function or feature of the consumption application is to display historical usage statistics, or a usage fee calculated over a given period of time, on the GUI. In step 930 the application logic calculates the historical cost and/or usage consumption based on information retrieved from storage. The storage device may be local or remote. In some embodiments the remote device or MCD stores all the usage history. In other embodiments the storage device is the storage facility of the ECAM device (accessed using local wireless technology, such as BLE). In still other embodiments the usage history is stored on a remote server and accessed via a network. In step 940 the usage history (historical data) is retrieved from the storage device. In step 950, the usage history is retrieved over a network (e.g. Internet, local network, etc.).

According to other functions or features of the consumption application, the application running on the remote computing device can project a future usage fee, for a predefined time, based on consumption data. For example, the GUI can display how much it would cost to run a particular appliance, for instance and air conditioner, for an hour, based on the current consumption rate and resulting cost.

In step 960 the calculated values discussed above are displayed on the GUI of the application. In some embodiments, a single consumption application running on a remote device can monitor more than one ECAM device at the same time.

When monitoring more than one device, the application can display the consumption values of each appliance connected to each ECAM device, distinctly from the display values of the other devices.

Figure 10:
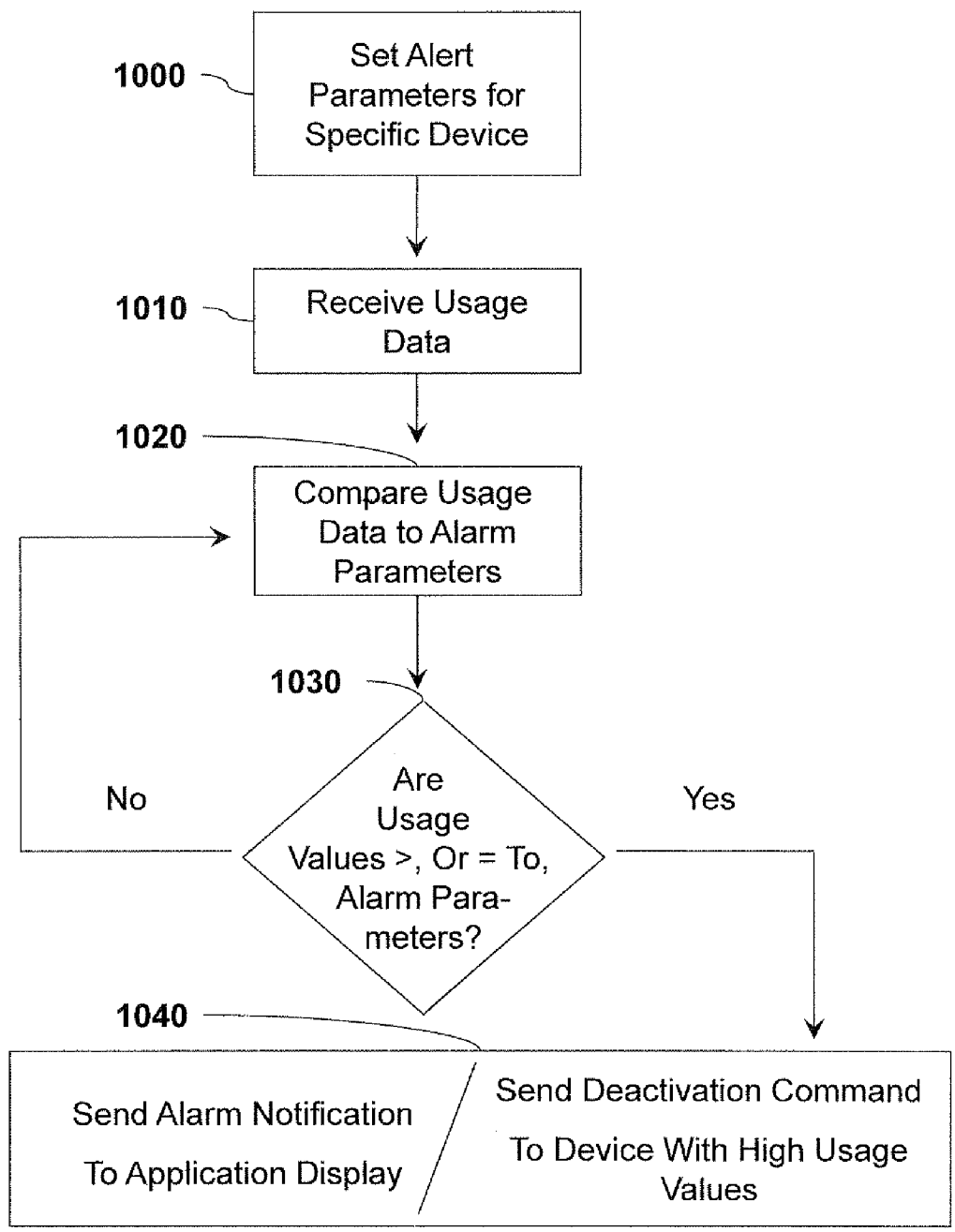
FIG. 10 is a flow chart of an Alarm process.

FIG. 10 is a flow chart of an Alarm process, effected from the application side of the inventive system. In step 1000 a user inputs instructions into the consumption application (embodied in software, firmware, hardware or a combination thereof) via the GUI. The instructions include alarm or alert parameters regarding a specific ECAM device. The alarm parameters can be a cost limit or energy limit for a given ECAM.

In step 1010, the remote device receives the consumption data from the selected ECAM. The data is processed as described above. In step 1020, the application running on the remote device compares the usage data, or processed usage data, to the alarm parameters.

In step 1030, the application logic decides whether the energy consumption is greater than or equal to the alarm parameters. If the energy consumption is still below the defined limit, then the application continues to compare new usage data to the alarm parameters.

If the consumption reaches or exceeds the user defined limit, then, in step 1040 either an alarm notification is displayed on the remote device GUI, or a deactivation command is sent to the device exceed the usage limit, or both. The monitored device is identified by the UUID of the ECAM.

For example, a user can decide to use the air conditioner for up to the equivalent of $10 a day. When the air conditioner has used energy equivalent to $10 based on the local tariff, an alarm sounds and/or the air conditioner is deactivated.

Figure 11:
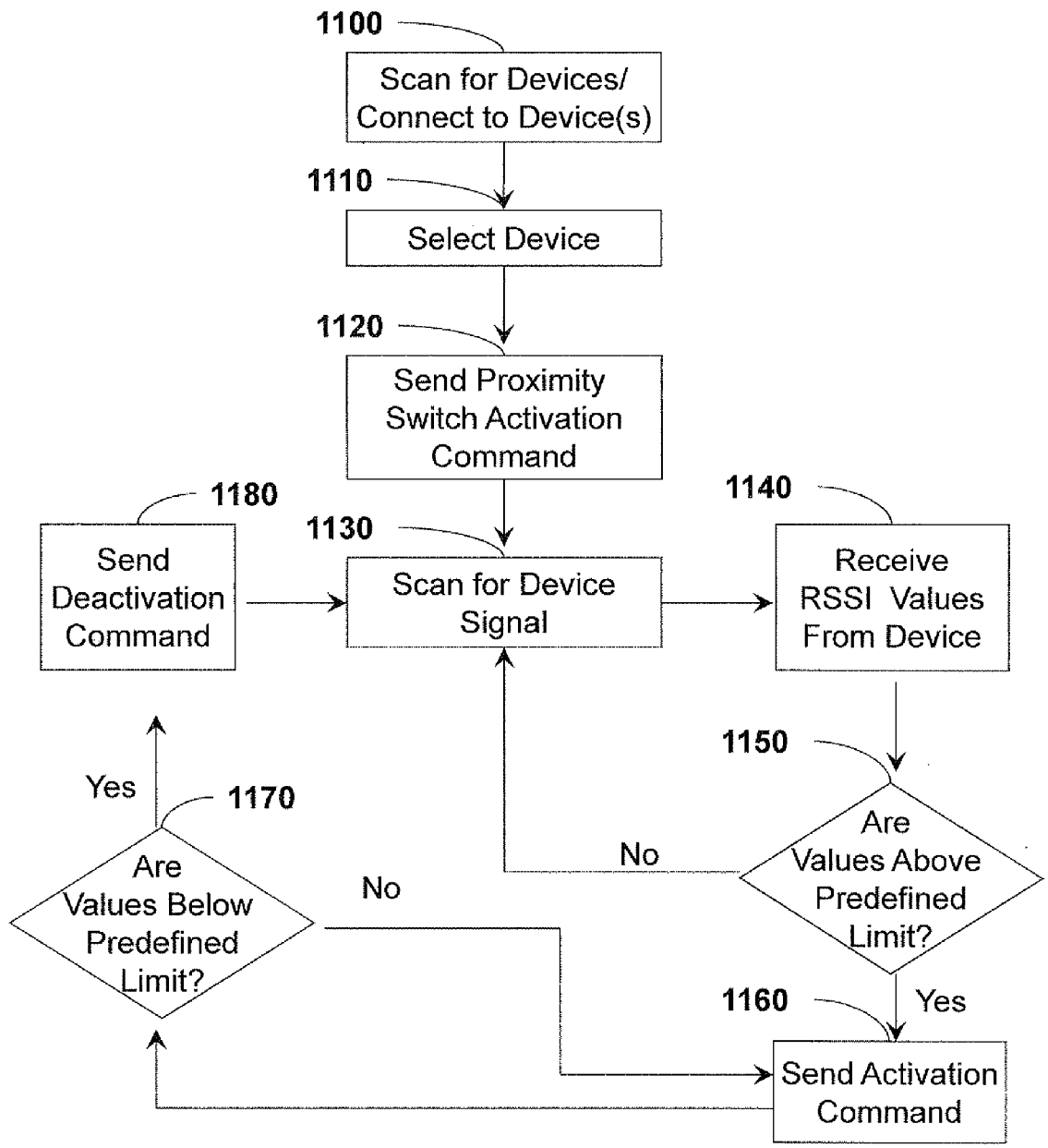
FIG. 11 a flow chart of a Proximity Switch process.

FIG. 11 a flow chart of a Proximity Switch process, effected from the application side of the inventive system. In step 1100 the consumption application (embodied in software, firmware, hardware or a combination thereof), which is preferably embodied in a mobile app, instructs the remote computing device, preferably an MCD, to scan for ECAM devices in the vicinity, or to automatically connect to the ECAM devices when detected.

In step 1110, the user inputs a selection parameter to select at least one ECAM device from among the detected or connected ECAM devices. In step 1120, the mobile app sends a Proximity Switch. Activation Command to the selected ECAM device or devices.

In step 1130, the mobile app waits for signal to be broadcast from the ECAM device. The signal may be triggered or sent automatically according to a predefined schedule (e.g. every second, every 20 milliseconds etc.). When the signal is sent and subsequently received by the MCD, the app determines an RSSI value or an average of RSSI values based on the signal strength, in step 1140. The approximate distance between the ECAM device and the MCD can be deduced based on the RSSI values. In step 1150, according to one embodiment, the app compares the RSSI values of the ECAM signal to the predefined limit (the limit can be factory defined or user-defined). If the RSSI values are above the predefined limit, then, in step 1160, an activation command is sent to activate the appliance coupled the selected ECAM device. When the RSSI values are above the predefined limit, it means that the MCD is within the predefined distance range (which is an approximate range) of the ECAM device.

In step 1170, new RSSI values are compared to the predefined limit. If the MCD is still in proximity to the ECAM device then the appliance remains active. When the received RSSI values are below the limit, then a deactivation command is sent to the ECAM, in step 1180. In another embodiment of the invention, the proximity switch works the other way around, so that an appliance is deactivated (or power is cut from an appliance attached to the ECAM) when the MCD comes into proximity of the ECAM, and reactivated when the MCD is no longer in the vicinity of the ECAM. For example, an alarm system can be deactivated when a permitted MCD is in the vicinity, and reactivated when the MCD leaves.

Figure 12:
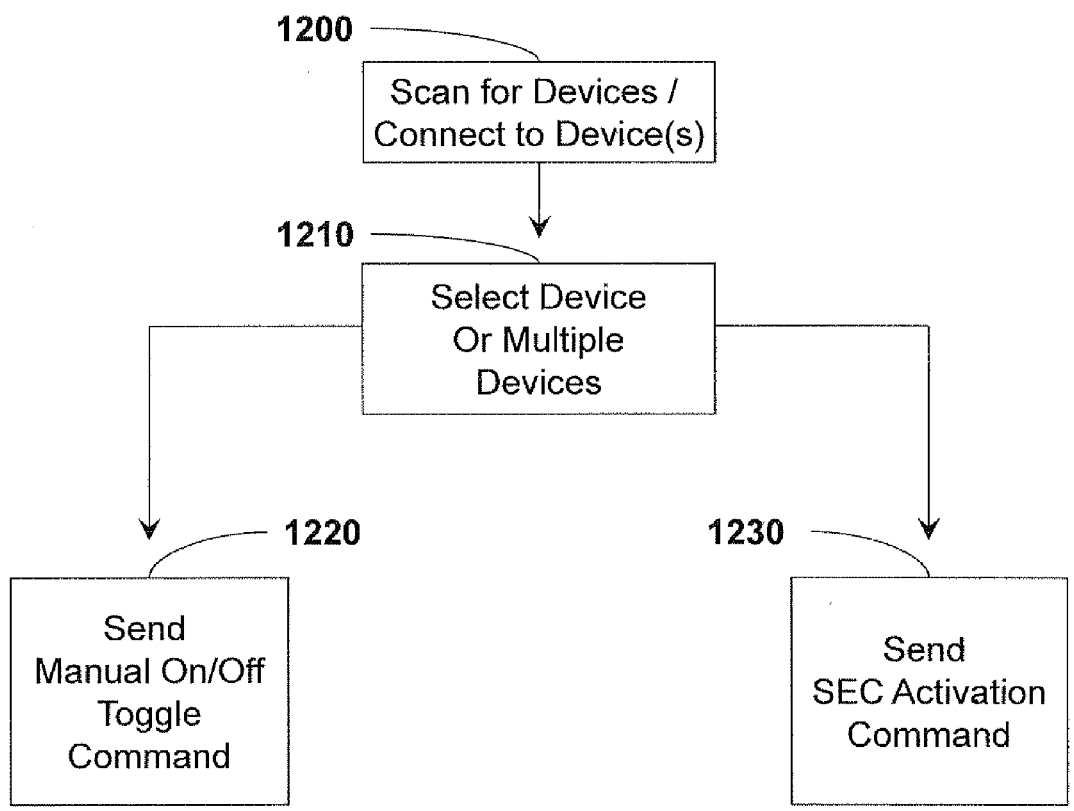
FIG. 12 is a flow chart of a Manual On/Off process and a SEC activation process.

FIG. 12 is a flow chart of a Manual On/Off process and a SEC activation process, effected from the application side of the inventive system. In step 1200 the consumption application (embodied in software, firmware, hardware or a combination thereof), which is preferably embodied in a mobile app, instructs the remote computing device, preferably an MCD, to scan for ECAM devices in the vicinity, or to automatically connect to the ECAM devices when detected.

In step 1210, the user inputs a selection parameter to select at least one ECAM device from among the detected or connected ECAM devices. In step 1220, the mobile app sends a Manual On/Off Toggle Command to the selected. ECAM device or devices. In step 1230, the mobile app sends an activation command to the selected ECAM device or devices to activate the Standby Energy Conservation (SEC) process.

The Manual On/Off process and the SEC process are both described in greater detail above, in relation to FIG. 8.

While the invention has been described with respect to a limited number of embodiments, it will be appreciated that many variations, modifications and other applications of the invention may be made. Therefore, the claimed invention as recited in the claims that follow is not limited to the embodiments described herein.

What is claimed is:

1. A system comprising:
  a portable device having an input end for operationally coupling to a power outlet and an output end for operationally coupling an appliance, said device including:
    (a) an energy consumption sensor;
    (b) a wireless communications component adapted for wireless communication; and
    (c) a processing unit, adapted to receive energy consumption data from said energy consumption sensor and transmit said energy consumption data via said wireless communications component; and
  a mobile application, configured to run on a mobile computing device (MCD), said mobile application adapted to receive said enemy consumption data via a wireless component on said (MCD):
  said mobile application configured to ascertain as exact location of said MCD by accessing location data on said MCI; and
  said mobile application configured to retrieve focal electricity tariff data based on said exact location.

2. The system of claim 1, wherein said processing unit is further configured to control power flow between said operationally coupled power outlet and said appliance operationally coupled thereto.

3. The system of claim 2, wherein said processing unit is configured to receive instructions from said mobile application.

4. The system of claim 3, wherein said processing unit is configured to selectively control said power flow based on instructions selected from the group consisting: said received instructions and a predefined set of instructions.

5. The system of claim 2, wherein said processing unit is configured to selectively control said power flow between said outlet and said appliance based on proximity to said MCD.

6. The system of claim 1, further comprising:
(d) a memory component, adapted to store said energy consumption data, wherein said processing unit is further adapted to transmit said stored energy consumption data via said wireless communications component.

7. The system of claim 1, wherein said MCD is a computing device configured to display data on a Graphical User Interface (GUI), wherein said data is selected from the group consisting of: said display data and said stored energy consumption data.

8. The system of claim 1, wherein said wireless communications component is a Bluetooth Low Energy component.

9. The system of claim 6, wherein said processing unit is further calable of wirelessly communication with a storage hub, said storage hub adapted to receive said usage data from multiple said devices.

10. The system of claim 1, wherein said local electricity tariff data is retrieved from a crowd sourcing database.

11. The system of claim 1, wherein said mobile application is further configured to calculate a usage fee in a local currency based on said exact location and said energy consumption data and said local electricity tariff data.

12. A method in a mobile computing device (MCD) comprising the steps of:
(a) receiving, at the MCD, consumption data transmitted from an energy consumption adaptor-monitor (ECAM) device, for processing by a consumption application running on the MCD;
(b) determining an exact location of the MCD;
(c) retrieving tariff data applicable to said exact location;
(d) processing said consumption data and said tariff data to receive display values;
(e) displaying said display values in a user interface of said consumption application, running on the mobile device.

13. The method of claim 12, further comprising the step of:
(f) receiving a unique user identifier (UUID) together with said consumption data, said UUID identifying said ECAM device which sent said consumption data.

14. The method of claim 13, further comprising the step of setting alarm parameters, prior to step (a).

15. The method of claim 14, wherein said processing step includes comparing said received consumption data to said alarm parameters and issuing an alert notification when said received consumption data exceed said alarm parameters.

16. The method 15, further comprising a step of sending a deactivation command to said ECAM device identified by said UUID, after receiving said notification alert.

17. The method of claim 12, further comprising the step of:
(f) storing said consumption data on a storage device.

18. The method of claim 17, wherein said processing includes functions selected from the group consisting of: calculating a projected usage fee over time based said received consumption data and calculating a usage fee over a given period of time based on consumption data stored on said storage device.

19. The method of claim 17, wherein said storage device is selected from the group consisting of a local storage device and a remote storage device, said remote storage device accessed over a network.

20. The method of claim 12, wherein said processing includes calculating a usage fee in a local currency based on said energy consumption and said retrieved tariff data.

21. The method of claim 12, wherein said tariff data is retrieved from a crowd sourcing means.

22. The method of claim 12, further comprising the step of:
(f) receiving consumption data from at least one additional ECAM device.

23. The method of claim 22, wherein said step of displaying said display values, includes displaying display-values for each of said at least two ECAM devices, distinctly from each other, on said user interface.

24. A method for use of a mobile communications device (MCD), the method comprising the steps of:
(a) sending a Proximity Switch Activation Command from the MCD;
(b) receiving a signal from an energy conservation adaptor-monitor (ECAM) device at the MCD;
(c) determining whether the MCD is within a predefined distance range from said ECAM device; and
(d) sending an activation command to said ECAM device while the MCD is within, said predefined distance range from said ECAM device, so as to selectively control activation of said ECAM device when within said predefined distance range.

25. The method of claim 24, where said predefined distance range is defined by a predefined Radio Signal Strength Indication (RSSI) value and wherein an RSSI value of said signal, from said ECAM device, is compared to said predefined RSSI value, in order to determine whether the MCD is within said predefined distance range from said ECAM.

26. The method of claim 16, further comprising the steps of:
(f) receiving, at the MCD, a wireless signal from a energy conservation adaptor-monitor (ECAM) device;
(g) receiving user input, at the MCD, for issuing instructions to said ECAM device; and
(h) sending said instructions to said ECAM device.

27. The method of claim 26, wherein said instructions include a standby energy-conservation (SEC) command, said SEC command configured to effect the steps of:
(i) determining whether an appliance operationally coupled to said ECAM device is in a standby mode;
(ii) determining whether, when in said standby mode, said appliance is consuming energy beyond a predefined limit; and
(iii) transforming a switch in said ECAM device from a closed state to an open state, when said appliance, in said standby mode, is consuming energy beyond said predefined limit, thereby disconnecting said appliance from a power source.

* * * * *

UNITED STATES PATENT AND TRADEMARK OFFICE
CERTIFICATE OF CORRECTION

PATENT NO. : 8,872,390 B2  
APPLICATION NO. : 14/068043  
DATED : October 28, 2014  
INVENTOR(S) : James Buchheim and Arne Hennig Page 1 of 1

It is certified that error appears in the above-identified patent and that said Letters Patent is hereby corrected as shown below:

IN THE CLAIMS:

COLUMN 14  
Claim 1, line 51 should be corrected as follows:

change  
--focal--  
to  
"local"

Signed and Sealed this  
Third Day of March, 2015

Michelle K. Lee  
*Deputy Director of the United States Patent and Trademark Office*

UNITED STATES PATENT AND TRADEMARK OFFICE
CERTIFICATE OF CORRECTION

Page 1 of 2

PATENT NO. : 8,872,390 B2
APPLICATION NO. : 14/068043
DATED : October 28, 2014
INVENTOR(S) : James Buchheim and Arne Henning It is certified that error appears in the above-identified patent and that said Letters Patent is hereby corrected as shown below:

In the Claims

Claim 1, Column 14 line 46 should be corrected as follows:
change
--enemy--
to
"energy"

Claim 1, Column 14 line 48 should be corrected as follows:
change
--as--
to
"an"

Claim 1, Column 14 line 50 should be corrected as follows:
change
--MCI--
to
"MCD"

Claim 9, Column 15 line 14 should be corrected as follows:
change
--calable--
to
"capable"

Signed and Sealed this
Ninth Day of June, 2015

Michelle K. Lee
*Director of the United States Patent and Trademark Office*

CERTIFICATE OF CORRECTION (continued)
U.S. Pat. No. 8,872,390 B2

Claim 9, Column 15 line 14 should be corrected as follows:
change
--communication--
to
"communicating"

Claim 24, Column 16 line 25 should be corrected as follows:
change
--is within, said--
to
"is within said"

Claim 26, Column 16 line 35 should be corrected as follows:
change
--16--
to
"12"